United States Patent [19]

Kogure et al.

[11] 4,377,765
[45] Mar. 22, 1983

[54] MODE COUPLED TUNING FORK TYPE QUARTZ CRYSTAL VIBRATOR AND METHOD OF TUNING

[75] Inventors: Shigeru Kogure; Eishi Momosaki; Minoru Inoue, all of Suwa, Japan

[73] Assignee: Kabushiki Kaisha Suwa Seikosha, Tokyo, Japan

[21] Appl. No.: 240,045

[22] Filed: Mar. 3, 1981

[30] Foreign Application Priority Data

Mar. 4, 1980 [JP] Japan .................................. 55-26958
Oct. 16, 1980 [JP] Japan ................................ 55-144827

[51] Int. Cl.³ ............................................ H01L 41/08
[52] U.S. Cl. .................................... 310/312; 310/370; 310/366; 29/25.35
[58] Field of Search ............... 310/312, 370, 366, 365, 310/361; 29/25.35

[56] References Cited

U.S. PATENT DOCUMENTS 3,969,640 7/1976 Staudte .......................... 310/370 X
4,320,320 3/1982 Momosaki et al. ............. 310/370 X

FOREIGN PATENT DOCUMENTS 55-13551 1/1980 Japan ................................... 310/370

Primary Examiner—Mark O. Budd
Attorney, Agent, or Firm—Blum, Kaplan, Friedman, Silberman & Beran

[57] ABSTRACT

A mode coupled tuning fork type quartz crystal vibrator utilizing two different vibrational modes is provided. The vibrator includes at least one electrode on each tuning fork arm for adjusting the resonant frequency of the main vibration and an electrode for adjusting the frequency-temperature characteristic of the vibrator. The main vibration is in the flexural mode ($F_1$) and the sub-vibration is in the torsional mode ($T_0$). The resonant frequency of the first overtone in the flextural mode is designated by $f_F$ and the resonant frequency of the fundamental vibration in the torsional mode is denoted by $f_T$. The difference between $f_F$ and $f_T$ defined as $\Delta f = f_F - f_T$ determines the frequency-temperature characteristics of the mode coupled vibrator.

The electrodes for adjusting $f_F$ are substantially triangular in shape and the electrodes for adjusting $f_T$ are substantially rectangular in shape. These electrodes are disposed at positions near the top of each tuning fork arm and on both principal surfaces of the vibrators. The resonant frequencies are adjusted by removing a portion of electrode material or adding a strip of metal to the electrode. Preselected oscillation frequency and frequency-temperature characteristics in the form of a cubic curve at ambient temperatures are obtained by first adjusting $\Delta f$ to a preselected value $\Delta f_O$ and then adjusting $f_F$ to a preselected value $f_{F0}$ at the same time maintaining $\Delta f$ at the value $\Delta f_0$.

33 Claims, 23 Drawing Figures

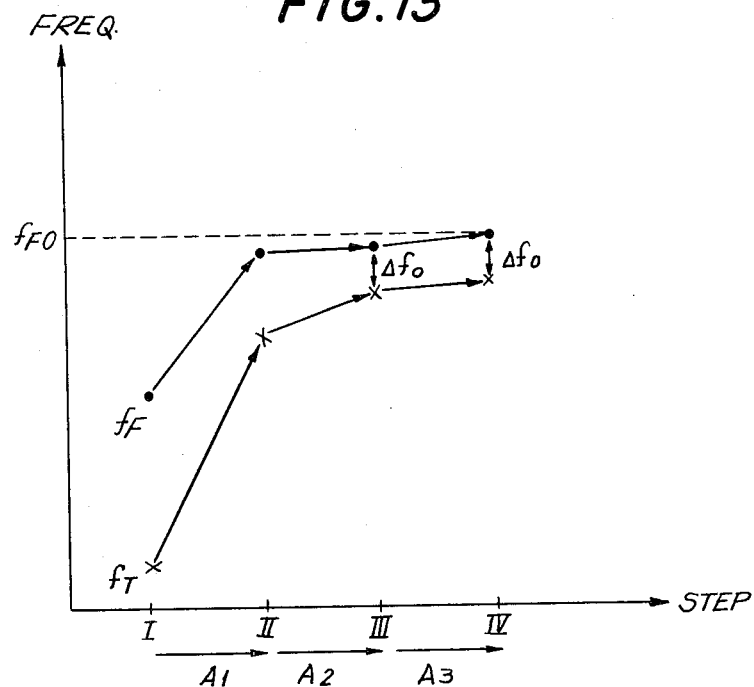
FIG.13
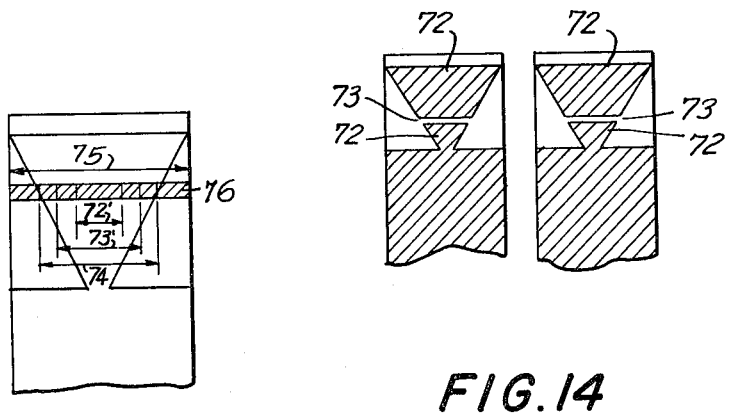
FIG.14
FIG.15

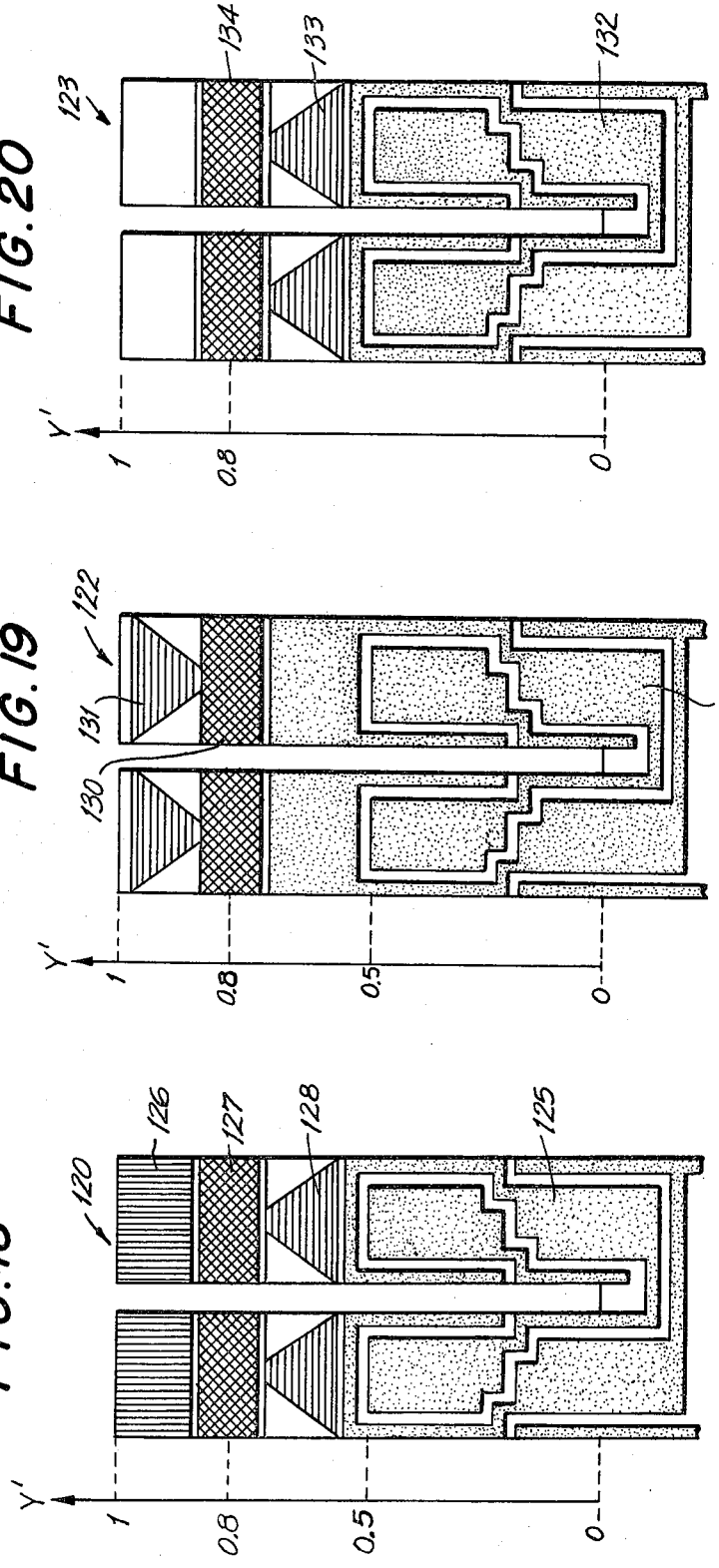

MODE COUPLED TUNING FORK TYPE QUARTZ CRYSTAL VIBRATOR AND METHOD OF TUNING

BACKGROUND OF THE INVENTION

This invention relates generally to mode coupled tuning fork type quartz crystal vibrators, and particularly to electrodes disposed in the region of the top of the tuning fork arms for adjusting the temperature-frequency characteristics of the vibrator.

Conventional electronic wristwatches generally utilize a tuning fork type quartz crystal vibrator which oscillates in the flexural mode. Such vibrators generally are cut from a +5° X-cut. These tuning fork type quartz crystal vibrators are advantageous with respect to accuracy, because the frequency-temperature characteristic is represented by a parabola at room temperature and the power consumption is relatively low due to its low frequency. However, even when this type vibrator is utilized in a conventional electronic wristwatch, the monthly rate of time accuracy is about 20 seconds, at best. Thus, in order to improve further the time accuracy and to construct an electronic wristwatch having an extended useful life, a mode coupled tuning fork type quartz crystal vibrator having a frequency-temperature characteristic in the shape of a cubic curve at low frequencies in room temperature has been proposed.

Mode coupled tuning fork type quartz crystal vibrators are described in detail in Japanese Patent Application Nos. 53-23,903, 53-149,499 and 53-149,500. These latter two Japanese patent applications correspond to U.S. application Ser. No. 42,732, filed on May 29, 1979 and assigned to the same assignee as this application. In the mode coupled tuning fork type quartz crystal vibrators described in these earlier patent applications and provided herein, a first overtone at the flexural mode is utilized as a main vibration and a fundamental vibration in the torsional mode is utilized as a sub-vibration. The resonant frequency of the first overtone in the flexural mode ($F_1$) is denoted by $f_F$ and the resonant frequency of the fundamental vibration in the torsional mode ($T_0$) is denoted by $f_T$. The difference between $f_F$ and $f_T$ is defined as $\Delta f = f_F - f_T$ which determines the frequency-temperature characteristics of the mode coupled tuning fork quartz crystal vibrator. When $\Delta f$ is a specified value, $\Delta f_0$, the frequency-temperature characteristic in the form of a cubic curve may be obtained at ambient temperatures.

When producing mode coupled tuning fork type quartz crystal vibrators problems arise as the frequency $f_F$ and $f_T$ vary due to inevitable variation in dimensions of the external form of the vibrators. Consequently, $\Delta f$ varies among the vibrators as does the frequency-temperature characteristic of each sample. It is also a problem that the resonant frequency of the main vibration is not the specified value in the same manner as in the case of a vibrator oscillating in a single mode. Thus, in order to be able to mass produce mode coupled tuning fork type quartz crystal vibrators, it is essential to be able to adjust the frequency-temperature characteristics and the resonant frequency of the main vibration. Accordingly, it is desirable to overcome the shortcomings in being able to mass produce mode coupled tuning fork type quartz crystal vibrators.

SUMMARY OF THE INVENTION

Generally speaking, in accordance with the invention, improved mode coupled tuning fork type quartz crystal vibrators and methods for obtaining same are provided. In the vibrators in accordance with the invention, a first overtone of the flexural mode is utilized as a main vibration and a fundamental vibration of the torsional mode is utilized as a sub-vibration. An electrode which does not extend across the full width of the tuning fork arm such as a triangular electrode, is disposed in the vicinity of the top of a tuning fork arm for adjusting the frequency-temperature characteristics of the vibrator.

The resonant frequency of the first overtone of the flexural mode ($F_1$) is denoted by $f_F$ and the resonant frequency of the fundamental vibration of the torsional mode ($T_0$) is denoted by $f_T$. The difference between $f_F$ and $f_T$ is defined as $\Delta f = f_F - f_T$ which determines the frequency-temperature characteristics of the vibrators in accordance with the invention. When $\Delta f$ is a specific predetermined value of $\Delta f_0$, a vibrator having frequency-temperature characteristics in the form of cubic curve is obtained in ambient temperatures. Adjustment to the optimal value $\Delta f_0$ is obtained by depositing or removing metal film in the region from about 0.1 to 0.4 from the top of tuning fork arms having a length 1.0. The $f_F$ is then adjusted to $f_{F0}$ while maintaining $\Delta f$ at $\Delta f_0$ by disposing a less than full-width electrodes, such as an inverted triangular electrode, in the regions from about 0 to 0.2 from the top of the tuning fork arm.

Accordingly, it is an object of the invention to provide an improved mode coupled tuning fork type quartz crystal vibrator.

It is another object of the invention to provide an improved method adjusting the frequency-temperature characteristics of a mode coupled tuning fork type quartz crystal vibrator.

It is a further object of the invention to provide improved mode coupled tuning fork type quartz crystal vibrators having temperature-frequency characteristics in the shape of cubic curves at ambient temperatures.

It is yet another object of the invention to provide an improved mode coupled tuning fork type quartz crystal vibrator suitable for use as a time standard in an electronic timepiece.

Still another object of the invention is to adjust the frequency-temperature characteristics of a mode coupled tuning fork type quartz crystal vibrator.

Still a further object of the invention is to adjust the resonant frequency of the first overtone of the flexural mode to a desired value.

It is another object of the invention to provide an improved mode coupled tuning fork type quartz crystal vibrator having an electrode for adjusting the resonant frequency of the first overtone of the flexural mode and an electrode for adjusting the difference between this frequency and the resonant frequency of the fundamental vibration of the torsional mode by another electrode.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 13 is a graphical representation illustrating the steps of the method for adjusting $f_F$ and $\Delta f$ for a vibrator of the type illustrated in FIG. 11;

FIG. 14 shows inverted triangular electrodes for finely adjusting $f_F$ following adjustment of $\Delta f$;

FIG. 15 shows the width of electrodes for finely adjusting $f_F$;

FIG. 18 is a plan view of a vibrator electrode pattern in accordance with another embodiment of the invention;

FIG. 19 is a plan view of a vibrator electrode pattern in accordance with a further embodiment of the invention;

FIG. 20 is a plan view of a vibrator electrode pattern in accordance with yet another embodiment of the invention;

DESCRIPTION OF THE PREFERRED EMBODIMENTS

Figure 1:
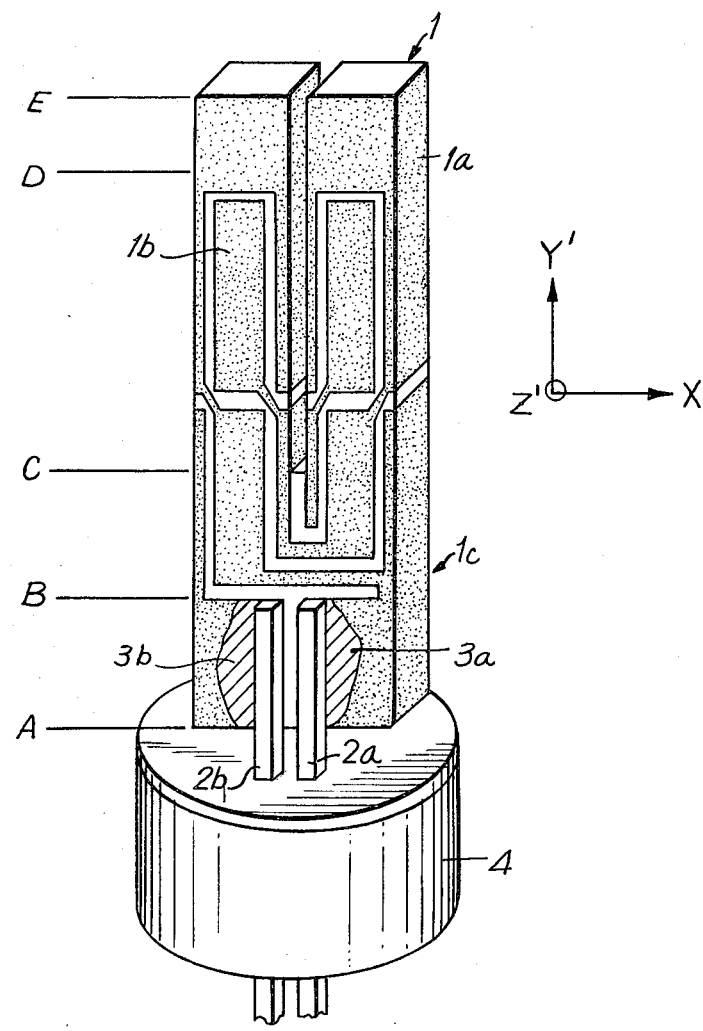
FIG. 1 is a plan view of a mode coupled tuning fork type quartz crystal vibrator.

FIG. 1 is a plan view illustrating the external appearance of a mode coupled tuning fork type quartz crystal vibrator indicated generally as 1. Vibrator 1 is shaped as a tuning fork having a pair of tuning arms 1a and 1b extending from a tuning fork base 1c. A pair of supporting leads 2a and 2b support vibrator 1 by solder regions 3a and 3b in the region of base 1c and extend through a plug 4 for providing electrical connection to the electrodes on the surface of vibrator 1. Vibrator 1 has axes X, Y' and Z'. X axis is an electric axis, Y' is a mechanical axis rotated around electric axis X and Z' is an optical axis rotated around electric axis X. As illustrated in FIG. 1, tuning fork arms 1a and 1b extend in the direction of mechanical axis Y'.

In mode coupled tuning fork type quartz crystal vibrator 1 utilized in accordance with the invention, a first overtone of the flexural mode is utilized as a main vibration and a fundamental vibration of the torsional mode is utilized as a sub-vibration. The resonant frequency of the first overtone of the flexural mode ($F_1$) is denoted by $f_F$ and the resonant frequency of the fundamental vibration of the torsional mode ($T_0$) is denoted by $f_T$. The difference between $f_F$ and $f_T$ is defined as $\Delta f = f_F - f_T$ which determines the frequency-temperature characteristics of vibrator 1. When $\Delta f$ is a specified predetermined value, $\Delta f_0$, the frequency-temperature characteristics approaches a cubic curve at ambient temperatures. In order to be able to mass produce mode coupled tuning fork type quartz crystal vibrators in accordance with the invention, it is essential to be able to adjust the frequency-temperature characteristic and the resonant frequency of the main vibration in view of production deviations.

Figure 2:
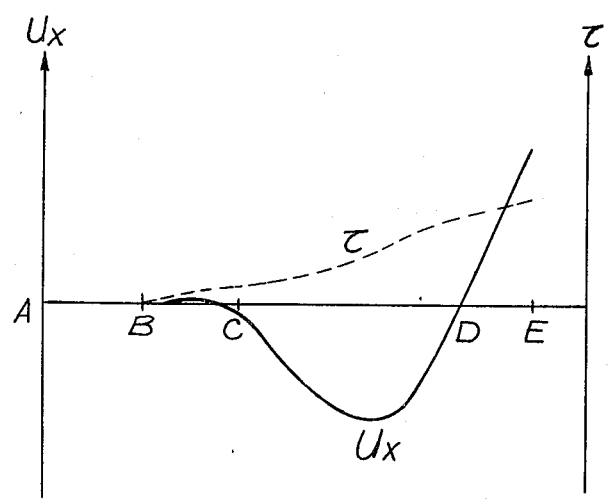
FIG. 2 is a graphical representation of the displacement distribution of vibration at the resonant frequencies of the first overtone of the flexural mode and the fundamental vibration of the torsional mode for the vibrator of FIG. 1.

Referring now to FIG. 2, the distribution of the X-directional displacement $U_x$ and $F_1$ and the distribution of the torsional angles $\tau$ of $T_0$ with respect to the center line of tuning fork arms 1a and 1b is shown. Positions A, B, C, D, and E along the abscissa in FIG. 2 correspond to positions A, B, C, D and E along the length of tuning fork arm 1a and 1b of vibrator 1 in FIG. 1, respectively. Since position D is a nodal point of the $F_1$ vibration, when metal electrode film is deposited on the portion of a vibrator arm or if the deposited film is removed by applying a laser beam in the region of position D, $f_F$ changes only slightly; however, $f_T$ may be reduced substantially or increased substantially by these respective adjustment steps.

Figure 3:
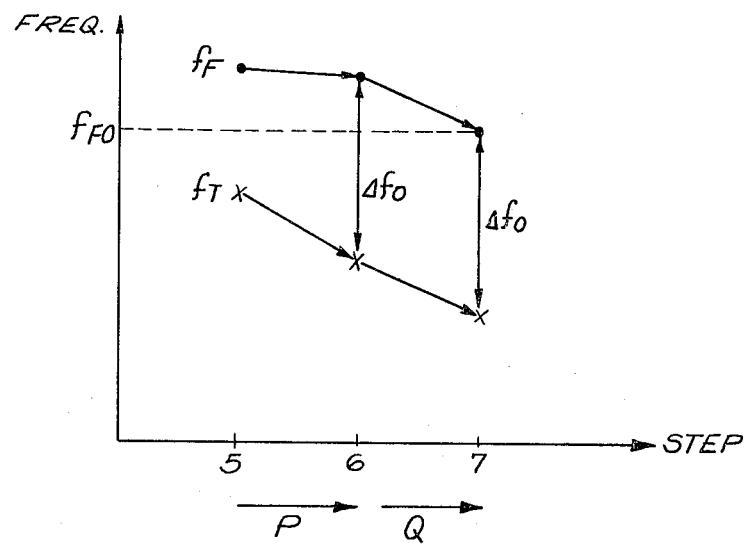
FIG. 3 is a graphical representation illustrating the steps of the method for adjusting $\Delta f = f_F - f_T$ and $f_F$ by depositing metal film in the vicinity of the top of a tuning fork arm.
Figure 4:
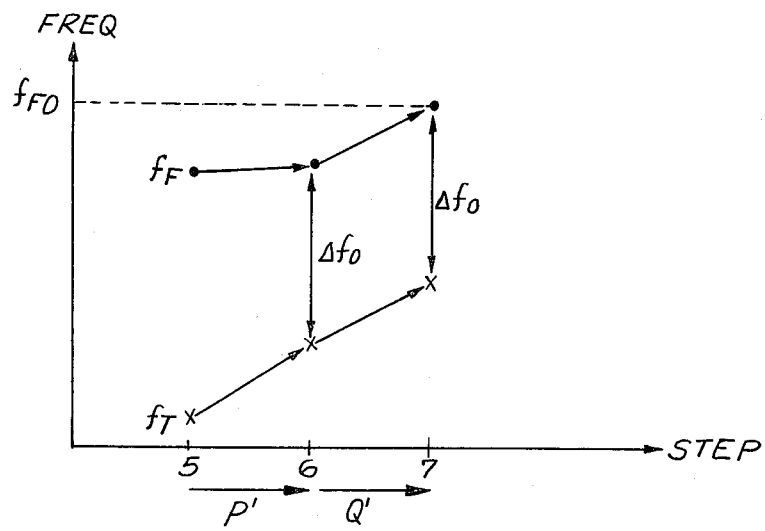
FIG. 4 is a graphical representation illustrating the method of adjusting $\Delta f$ and $f_F$ by removing metal film by a laser in the vicinity of the top of a tuning fork arm.

Referring now to FIGS. 3 and 4, graphical representations of the steps for adjusting $\Delta f$ and $f_F$ are shown. For purposes of discussion of FIGS. 3 and 4, frequency is plotted on the ordinate and the state of the vibrator at the indicated operational steps is plotted on the abscissa. The designated frequency is $f_{F0}$ and is of a predetermined value for providing a vibrator having the desired frequency-temperature characteristics. P in FIG. 3 represents the steps of depositing metal film and P' in FIG.

4 represents removal of metal film by a laser beam in the vicinity of the top of the tuning fork arms. In these cases the condition of $\Delta f$ and $f_F$ are adjusted as illustrated in FIGS. 3 and 4. Specifically, FIG. 3 shows that by depositing metal film in step P from an initial state represented by 5 to an intermediate step represented by 6, $f_F$ is not effected significantly, whereas $f_T$ is lowered so that $\Delta f$ is adjusted to the optimal value of $\Delta f_0$ in intermediate state 6.

In FIG. 4, $f_F$ is shifted from its initial state 5' to intermediate state 6' by step P' following removal of metal film by applying a laser beam. In this step P', $f_F$ remains substantially the same, whereas $f_T$ increases upon removal of metal film so that $\Delta f$ approaches $\Delta f_0$ in intermediate step 6'.

In each case illustrated in FIGS. 3 and 4 following adjustment of $\Delta f$ by steps P and P', it is necessary now to adjust $f_F$ of states 6 and 6' to $f_{F0}$ of states 7 and 7' by steps Q and Q'. Following steps Q and Q' $\Delta f$ must be maintained at the adjusted value $\Delta f_0$. It is known to deposit metal film between region E and D at the end of a vibrator arm, or merely to remove deposited film by applying a laser beam. However, according to these methods of addition or removal of deposited metal film, $\Delta f$ changes when changing $f_F$. Consequently, the vibrator does not have $\Delta f_0$ following the adjustment of $f_F$ to $f_{F0}$. This represents a serious deficiency in the prior art.

Figure 5:
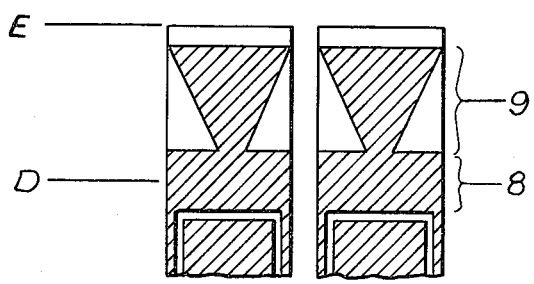
FIG. 5 is a plan view of an electrode pattern for adjusting $\Delta f$ and an electrode for adjusting $f_F$ in the vicinity of the top of the tuning fork arm in accordance with the invention.

Turning now to FIG. 5, an embodiment illustrating the shape of the electrodes in the vicinity of the top of the tuning fork arms of a mode coupled tuning fork type quartz crystal vibrator in accordance with the invention is shown. Positions E and D in FIG. 5 correspond to positions E and D in FIGS. 1 and 2. The vibrator of FIG. 5 has an electrode film 8 formed on the nodal point D of $F_1$, the flexural mode and is the electrode on which adjustment steps P and P' as shown in FIGS. 3 and 4 are performed to adjust of $\Delta f$ of the vibrator.

Electrode film 8 may be identified as the electrode for adjusting $\Delta f$. Electrodes 9 disposed at the ends of the tuning fork arms are the electrodes for adjusting $f_F$ to $f_{F0}$ while maintaining $\Delta f$ at a value $\Delta f_0$. In accordance with the invention electrode 9 does not extend across the full width of the tuning fork arm and in this exemplary embodiment in FIG. 5 is in the shape of an inverted triangle with its base at the top of the tuning fork arm. If additional metal film is deposited on the inverted triangular region of $f_F$ adjusting electrode 9, or if portions of metal film are removed from $f_F$ adjusting electrode 9 by applying a laser beam, $f_F$ can be adjusted to $f_{F0}$ while maintaining $\Delta f$ at the predetermined value $\Delta f_0$. These adjustments of $f_F$ to $f_{F0}$ while maintaining $\Delta f_0$ are shown as step Q in FIG. 3 and step Q' in FIG. 7. This adjustment adjusts the frequency-temperature characteristics of the vibrator from intermediate states 6 and 6', respectively, to states 7 and 7', respectively. Both adjustments result in mode coupled tuning fork type quartz crystal vibrators having the desired characteristics at final states 7 and 7'.

Figure 6:
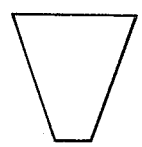
FIG. 6 illustrates an inverted triangular electrode pattern for adjusting $f_F$.

The preferred shape of the electrode for adjusting $f_F$ is generally in the form of an inverted triangle with the lower vertex flattened as shown in FIG. 6. The reasons why an electrode of this configuration is effective for adjusting $f_f$ is believed as follows. As shown in FIG. 2, displacement in the flexural mode $U_x$ is large in the region between position D and position E, but displacement of $\tau$ is small in this region. Additionally, displacement in the torsional mode caused by $\tau$ becomes smaller near the center of a tuning fork arm and is larger in the edge region of a tuning fork arm. In contrast, $U_x$ is almost equal in the center or in the edge of a tuning fork arm.

Figure 7:
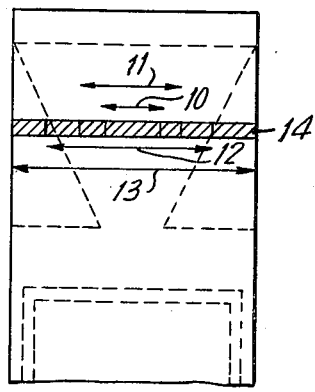
FIG. 7 is a plan view illustrating deposition of a metal film electrode in a long-narrow strip across the width of a tuning fork arm for adjusting $\Delta f$.
Figure 8:
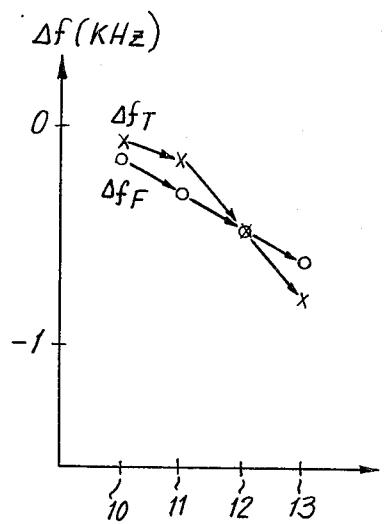
FIG. 8 is a graph illustrating the change in resonant frequencies in the flexural mode and torsional mode for varying widths of metal film in the vicinity of the top of the tuning fork arms illustrated in FIG. 7.

Referring now to FIG. 7, when metal film is deposited in the region between position D and E on the length of the tuning fork arm, as shown by a shaded region 14, with respective widths indicated by arrows 10, 11, 12 and 13, different variations of $f_F$ and $f_T$ occur as shown by $\Delta f_F$ and $\Delta f_T$ in FIG. 8. Therefore, when metal film is deposited on a tuning fork arm with a width across the are as indicated by arrow 12, the decrease in the amount of $f_F$ about equals the decrease in the amount of $f_T$. In other words, there exists a width of metal film which when deposited results in a decrease in the value of $f_F$ which is equal to decrease in the value of $f_T$. When the position along the tuning fork arm of metal film region 14 is displaced along the length between D and E, there is a new width of film 14 where $\Delta f_F$ equals $\Delta f_T$ in the new position. Since $U_x$ decreases rapidly along the length of the tuning fork arm as one approaches position D, the width of film 14 to be added at D where $\Delta f_F$ equals $\Delta f_T$ is also small. Conversely, as $U_x$ increases as the position approaches position E, the width of the film region 14 where $\Delta f_F$ equals $\Delta f_T$ is also large. Accordingly, the shape of an electrode for adjusting $f_F$ may be an inverted triangle as shown by electrode 9 in FIGS. 5 and 6.

Referring specifically to FIG. 8, a graphical illustration corresponding to this description is shown. In FIG. 8, abscissa values 10', 11', 12' and 13', respectively, correspond to widths of metal film corresponding to arrows 10, 11, 12 and 13 in FIG. 7. In FIG. 8, $\Delta f_F$ and $\Delta f_T$ show the difference between the frequency after the depositing of metal film having a length of shaded region 14 and the frequency prior to depositing the metal film. For the same reasons, $f_F$ and $f_T$ can be increased by the same value when metal film is removed by applying a laser beam for adjusting $f_F$. Thus, in order to adjust $\Delta f$ and $f_F$, $\Delta f$ may be adjusted by depositing metal film in the vicinity of the end of a tuning fork arm and $f_F$ can be adjusted by removal of film by applying a laser beam. Similarly, $\Delta f$ can be adjusted by applying a laser beam to remove the metal film and $f_F$ can be adjusted by depositing metal film.

When making adjustments by removal of metal film by applying a laser beam, it is generally effective to have thickly deposited or plate the tuning fork arm previously with the metal film. This depositing or plating may be done on one or both of the electrodes for adjusting $\Delta f$ and for adjusting $f_F$ in order to make the value of the adjustments larger.

Generally speaking, the nodal point D of the first overtone of the flexural mode, $f_1$, exists at the position of about 0.2 from the top of a tuning fork arm, assuming that the length of the tuning fork arm is 1.0. In such a case, it is necessary that electrode 8 for adjusting $\Delta f$ be disposed in the region of a position about 0.1 to 0.4 from the top of the tuning fork arm and that the electrode for adjusting $f_F$ is disposed in the region of about 0 to 0.2.

Figure 9:
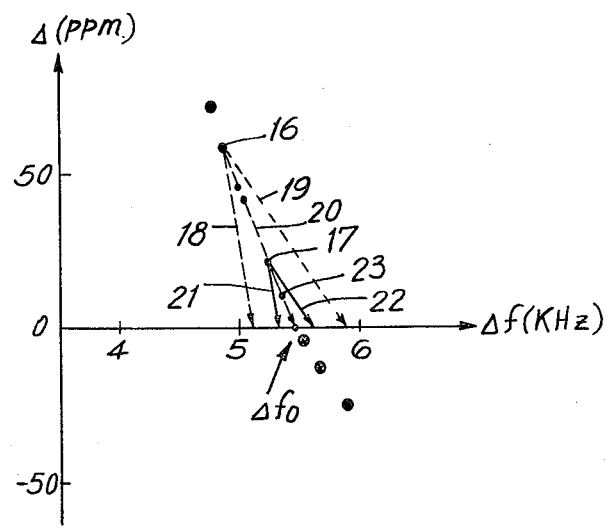
FIG. 9 is a graph illustrating the difference in variation of the frequency-temperature characteristics in the case of depositing metal film on one principal surface and both principal surfaces of the tuning fork arm.

When adjusting the frequency-temperature characteristic and resonant frequency of a mode coupled tuning fork type quartz crystal vibrator in accordance with the invention, the electrode for adjusting $\Delta f$ and the electrode for adjusting $f_F$ are also disposed on the opposed principal surface of the tuning arm. The reason for this is as follows. The difference in the frequency-temperature characteristics caused by variations in production are illustrated in FIG. 9 wherein the ordinate represents the variation amount (Δ) of $f_F$ when the temperature is between about 0° C. and 40° C. The abscissa represents Δf. The dots show data points and Δ is plotted with respect to Δf.

When metal film is deposited on the electrode for adjusting Δf of the −Z' plane of the vibrator having the characteristics of data point 16, the frequency-temperature characteristics change is shown by an arrow 18. When the same operation as just described is performed on the +Z' plane only, the frequency-temperature characteristics change is shown by an arrow 19. When metal film is deposited on the electrode for adjusting Δf of both the −Z' plane and the +Z' plane, the frequency-temperature characteristics varies in accordance with an arrow 20 and results in a Δf of Δf$_0$.

When this same operation is performed on a vibrator having the characteristic of data point 17, and Δf is adjusted with respect to only the −Z' plane the frequency-temperature characteristics changes as illustrated by an arrow 21. Similarly, when only the +Z' plane electrode is adjusted, the frequency-temperature characteristics changes as shown by an arrow 22. However, when both the +Z' plane and the −Z' plane electrodes of this vibrator 17 are adjusted, the frequency-temperature characteristics change proceeds along an arrow 23 and results in a Δf of Δf$_0$.

This comparison shows that when the metal film is deposited only on an electrode for adjusting Δf in one plane, (or the deviation) of the vibrator illustrated by data point 16 and Δ of the vibrator illustrated by data point 17 becomes much smaller, but they take different values of Δf at a Δ about equal to 0. However, when a metal film is deposited on the electrodes for adjusting Δf in both planes, the Δ between the two vibrators becomes small where Δf is Δf$_0$ as shown by arrows 20 and 23. This is a substantial advantage because the frequency-temperature characteristics can be adjusted by controlling Δf during mass production.

Similarly, when metal film of the previously added electrode for adjusting Δf is cut off with a laser beam, the desired frequency-temperature characteristics approaching the cubic curve can be obtained at Δf$_O$ by removing metal film on both opposed principal surfaces of the vibrator arm.

When disposing the electrode for adjusting $f_F$, it is necessary that the electrode be disposed on both the +Z' plane and the −Z' plane of the tuning fork arm. Similarly, the metal film is disposed or removed on both opposed surfaces. If the operation step is not performed on the electrode in both planes, even though $f_F$ can be adjusted to $f_{F0}$ while maintaining Δf at Δf$_0$, the frequency-temperature characteristics deviates between vibrators. In other words, the value of Δf by which the frequency-temperature characteristics of a cubic curve is obtained is not Δf$_0$. Accordingly, it is necessary that both the electrode for adjusting Δf and the electrode for adjusting $f_F$ are disposed on both opposed principal surfaces of each tuning fork arm and that the adjusting operation in accordance with the invention be performed on the electrodes in both planes.

Figure 10:
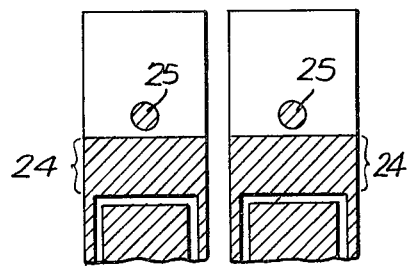
FIG. 10 illustrates an electrode configuration for adjusting $f_F$ in accordance with another embodiment of the invention.

Referring specifically to FIG. 10, an electrode for adjusting $f_F$ in accordance with a further embodiment of the invention is shown. The electrode for adjusting Δf is shown by reference numeral 24 and an electrode for adjusting $f_F$ is shown by reference numeral 25. The electrode for adjusting $f_F$ 25 is in the form of a circle which does not extend across the full width of the tuning fork arm and relies on only the lower portion of an inverted triangular electrode for adjusting $f_F$ as illustrated in FIG. 5.

Figure 11:
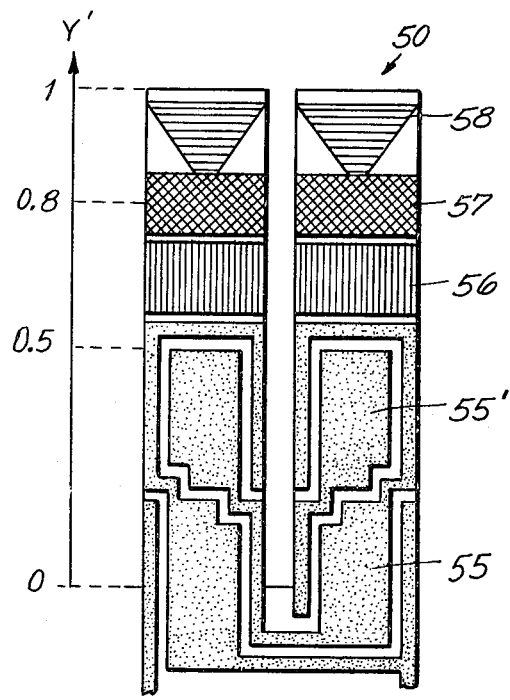
FIG. 11 illustrates a mode coupled tuning fork type quartz crystal vibrator arranged in accordance with a further embodiment of the invention.

FIG. 11 illustrates a mode coupled tuning fork type quartz crystal vibrator referred to generally as 50 constructed and arranged in accordance with yet another embodiment of the invention. Vibrator 50 includes excitation electrodes 55 and 55' indicated by the speckled shading. Excitation electrodes 55 and 55' extend from the base of vibrator 50 to a position about one half the length of the tuning fork arms. An electrode 56 for roughly adjusting $f_F$ is indicated by vertical shading lines. An additional electrode 57 for adjusting Δf indicated by cross-hatching in the region of the nodal point of the flexural vibrational mode and an electrode 58 for finely adjusting $f_F$ marked with horizontal shading lines in the vicinity of the end of the vibrator arms are also provided. The Y' axis is parallel to the longer direction of the tuning fork as in the case of the vibrator in FIG. 1. For a vibrator having an arm of length 1.0, the base of the tuning fork arm is identified as 0 and the ends are defined as 1.0 on the Y' axis. In accordance with the invention, $f_F$ is adjusted to $f_{FO}$ and Δf is adjusted to Δf$_0$ by utilizing electrode 56 for roughly adjusting $f_F$, electrode 57 for adjusting Δf and electrode 58 for finely adjusting $f_F$. Preparation of such a mode coupled tuning fork type quartz crystal vibrator in accordance with the invention is as follows.

Figure 12:
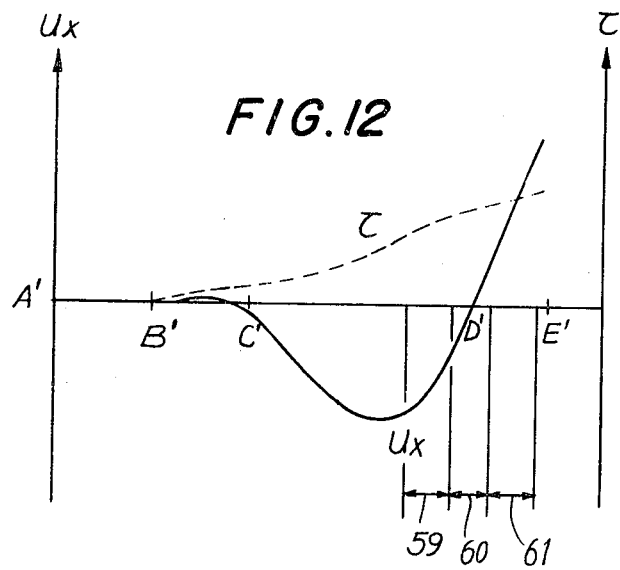
FIG. 12 is a graphical representation of the displacement distribution of vibration at the resonant frequencies of the first overtone of the flexural mode and the fundamental vibration of the torsional mode for the vibrator of FIG. 11.

FIG. 12 shows the distribution of the X-directional displacement $U_x$ of the flexural mode, $f_1$, and the distribution of the torsional angle $\tau$ of the torsional mode, $t_0$ with respect to the center line of a tuning fork arm. Positions A', B', C', D' and E' along the abscissa correspond to positions A, B, C, D, and E in FIG. 1, respectively. The value of $U_x$ has a loop caused by the vibration in the region of the middle of the tuning fork arm, a nodal point of the vibration at the position D, and a maximum value at the top of the tuning fork arm. The value of $\tau$ remains a maximum value in the region of the top of the tuning fork arm and continually decreases towards the fork or base region of the vibrator. In this respect, the representation in FIG. 12 is the same as the graphical representation in FIG. 2. Referring specifically to the electrodes on vibrator 50 in FIG. 11, electrode 56 for roughly adjusting $f_F$ is disposed at a position in the region indicated by 59, electrode 57 for adjusting Δf is disposed at a position in the region indicated by 60, and electrode 58 for finely adjusting $f_F$ is disposed at a position in the region indicated by 61.

Referring now to FIG. 13, the step changes of $f_F$ and $f_T$ resulting from adjusting $f_F$ and Δf by utilizing electrodes 56, 57 and 58 are shown. The abscissa axis in FIG. 13 depicts adjustment steps A$_1$, A$_2$ and A$_3$ for adjusting the characteristics from states I, II and III to final stage IV. These states are the initial state, the state after roughly adjusting $f_F$ by electrode 56, the state after adjusting Δf by electrode 57 and the final state after finely adjusting $f_F$ by electrode 58. A$_1$, A$_2$ and A$_3$ are respectively the operations of roughly adjusting $f_F$, the operation of adjusting Δf and the operation of finely adjusting $f_F$.

Operational step A$_1$ for roughly adjusting $f_F$ by electrode 56 is as follows. Electrode 56 for roughly adjusting $f_F$ is disposed in the region of position 59 in FIG. 12 wherein the values of displacement $U_X$ and $\tau$ are both large. Therefore, the values of both $f_F$ and $f_T$ increase when electrode material in region 59 is removed by applying a laser beam. When $f_F$ reaches a value about 100 ppm lower than $f_{F0}$, step A$_1$ for roughly adjusting $f_F$ is completed and the vibrator is at state II, namely the state after roughly adjusting $f_F$.

During operation $A_2$ adjusting of $\Delta f$ is performed. Electrode 57 for adjusting $\Delta f$ is at a position in the region 60 along the tuning fork arm wherein displacement $U_X$ is very small and twist angle $\tau$ is large. Therefore, $f_F$ increases only slightly and $f_T$ increases more rapidly when electrode material is removed in range 60 by applying a laser beam to the electrode. When $\Delta f$ of the vibrator reaches $\Delta f_0$, operation $A_2$ for adjusting $\Delta f$ is completed and the vibrator has the characteristics of state III, namely the state after adjusting $\Delta f$. Finally, operation $A_3$ for finely adjusting $f_F$ is performed. During this final adjustment, it is necessary to adjust $f_F$ to $f_{F0}$ while maintaining $\Delta f$ at a value of $\Delta f_0$. Accordingly, an electrode having a shape which does not extend across the full width of the tuning fork arm. Electrode 58 has the particular shape of an inverted triangle as shown in FIG. 11 in this exemplary embodiment.

Referring specifically to FIG. 14, the electrode at the top of the vibrator tuning fork arms wherein $f_F$ has been finely adjusted by removing a portion of an electrode 12 $f_F$ by applying a laser beam thereto is shown. Region 73 is a space formed after removing a strip of electrode 72 by a laser beam. In operational step $A_3$ for finely adjusting $f_F$, a portion of the electrode for finely adjusting $f_F$ is removed across the full width of the electrode as illustrated in FIG. 14. When a portion of the electrode along the length of the arm is removed in this manner, $f_F$ can be adjusted to $f_{F0}$ while maintaining $\Delta f$ at a predetermined value of $\Delta f_0$. This is the case because $f_F$ and $f_T$ change the same amount. Following this operational step $A_3$, the vibrator characteristics are those of final state IV, wherein $f_F$ corresponds to $f_{F0}$ and the frequency-temperature characteristics is that of a cubic curve at ambient temperatures.

The reasons why electrode 58 on the vibrator of FIG. 11 for finely adjusting $f_F$ is of the particular shape shown are as follows. At a position on the tuning fork arm in range 61 of FIG. 12, the change of displacement $U_x$ is large, whereas the change in is small. The displacement generated by $\tau$ is less in the region nearer to the center of the tuning fork arm and is larger towards the edge of the tuning fork arm. $U_x$ remains about the same even the center of the tuning fork arm or in the edge of the tuning fork arm.

Figure 16:
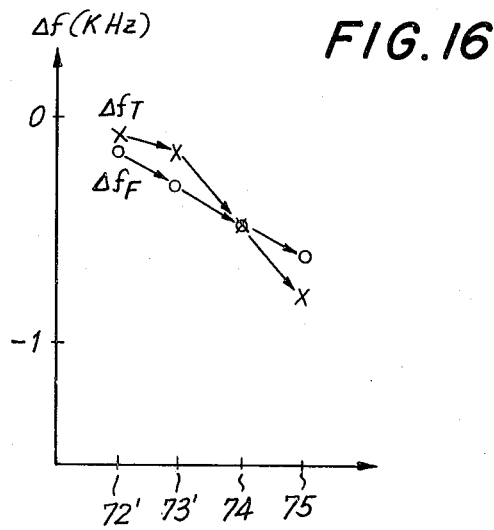
FIG. 16 is a graph illustrating the change in resonant frequencies in the flexural and torsional mode for varying the width of the metal film in the vicinity of the top of the tuning fork arms as illustrated in FIG. 15.

Referring specifically to FIGS. 15 and 16, when metal film electrode is deposited in a position at shaded region 16 in varying widths the changes in $f_F$ and $f_T$ vary as 72', 73', 74 and 75 as shown in FIG. 16. Specifically, when film portion 76 is of a width across the tuning fork arm corresponding to the length of arrows 72', 73', 74 and 75 as shown in FIG. 15, the change in the resonant frequency of the first overtone of the flexural mode, $f_F$ and the change in resonant frequency of the fundamental vibration of torsional mode, $f_T$, is in accordance with the data points indicated by a circle and an x, respectively, in FIG. 16. Accordingly, when metal film is deposited having the width of arrow 74, the decrease in value of $f_F$ and $f_T$ are equal to each other. In other words, there is a width of the metal film which will lower the value of $f_F$ and $f_T$ equal amounts.

When the position of deposited metal film portion 76 is varied along the length of the tuning fork arm, there also exists varying widths wherein $\Delta f_F$ and $\Delta f_T$ are equal to each other. When the position of deposited metal film 76 approaches D, the nodal point of first overtone of the flexural mode, the width across the tuning fork arm wherein $\Delta f_F$ and $\Delta f_T$ are equal is smaller, because displacement $U_x$ decreases rapidly. Conversely, when the position of deposited metal film 76 approaches E the top of the tuning fork arm, the width of the deposited film wherein $\Delta f_F$ and $\Delta f_T$ are equal becomes larger because displacement $U_x$ is large at this point. Therefore, in a preferred embodiment of the invention, electrode 58 for finely adjusting $f_F$ in FIG. 11 takes on the shape of an inverted triangle as illustrated in FIG. 2. In FIG. 16, the varying widths of the deposited film 76, namely, 72', 73', 74 and 75 correspond to the width indicated by the arrows in FIG. 15. The values of $\Delta f_F$ and $\Delta f_T$ represent the difference in the frequency after depositing metal film 76 and the frequency prior to depositing metal film. Thus, deposition of metal film tends to decrease the resonant frequency of both the first overtone of the flexural mode, $f_F$ and the resonant frequency of the fundamental vibration of the torsional mode, $f_T$. Conversely, for these same reasons, $f_F$ and $f_T$ can be increased in equal amounts by applying a laser beam for removing electrode portions for finely adjusting $f_F$ in an increasing direction.

In order to construct and arrange a mode coupled tuning fork type quartz crystal vibrator in accordance with the invention, each electrode for adjusting the freuencies is disposed at a position along the tuning fork arm as follows. Referring specifically to FIG. 11 and vibrator 50 shown therein, the tuning fork arms are assumed to be of length 1.0 in the direction of Y' axis. Electrode 56 for rough adjustment of $f_F$ is disposed in the region having a Y' value of from about 0.5 to 0.7 or from about 0.3 to 0.5 from the top of the tuning fork arm. Electrode 57 for adjusting $\Delta f$ is disposed along Y' axis the region from about 0.6 to 0.9, or about 0.1 to 0.4 from the top of the tuning fork arm. Finally, electrode 58 for finely adjusting $f_F$ is disposed in the region from about 0.8 to 1.0 on Y' axis, or about 0 to 0.2 from the top of the tuning fork arm.

Figure 17:
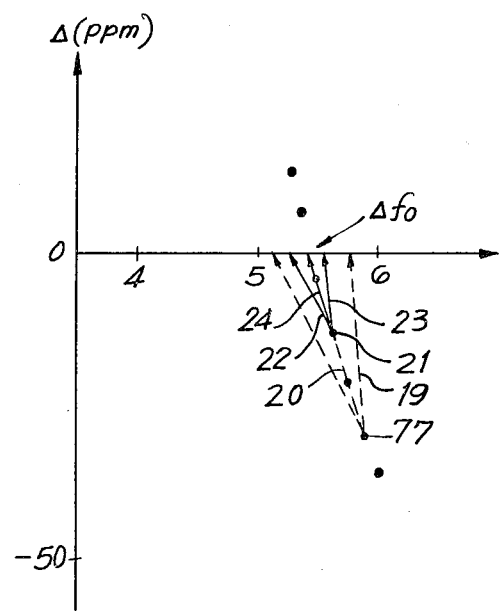
FIG. 17 is a graph illustrating the difference in $\Delta f$ when metal film is removed by a laser beam on the $+Z'$ plane and the $-Z'$ plane of the vibrator.

In accordance with the preferred embodiments of the invention, electrodes 56, 57 and 58 as illustrated in FIG. 11 are disposed on the reverse and opposed side of the tuning fork arms in the same film thicknesses. The reasons for disposing the electrodes on the opposed surface will be described in connection with FIG. 17. This figure illustrates the difference in the frequency-temperature characteristic, $\Delta f$, caused by the variation in production. The variation amount ($\Delta$) of $f_F$ between 0° C. and 40° C. is plotted along the ordinate and $\Delta f$ is plotted along the abscissa. The data points show $\Delta$ with respect to $\Delta f$.

When only electrode 57 for adjusting $\Delta f$ in the $-Z'$ plane of the vibrator having characteristics of data point 77 is removed by applying a laser beam thereacross, $\Delta$ changes in accordance with arrow 79. Similarly, when only electrode 57 for adjusting f in the $+Z'$ plane is removed by laser beam, $\Delta$ changes as shown by arrow 78. When electrode 57 for adjusting $\Delta f$ in both the $-Z'$ plane and $+Z'$ plane are removed by the laser beam, $\Delta$ changes as indicated by an arrow 80.

Similarly, for a vibrator having the characteristics of data point 21, when this operation is performed only on the $-Z'$ plane or only the $+Z'$ plane $\Delta$ changes with respect to arrows 23 and 22, respectively. When the operation is performed on both the $+Z'$ and $-Z'$ planes of the vibrator, $\Delta$ changes as shown by arrow 24. Thus, if only electrode 57 for adjusting $\Delta f$ of one plane is removed, the values of $\Delta f$ wherein $\Delta$ is 0 are different for the vibrators having the characteristics of data point 21 and the vibrator having the characteristics of data point 17. However, when the electrodes for adjusting Δf of both planes are removed by applying a laser beam across the electrode, the value of Δ is reduced to 0 when Δf is Δf₀ in both vibrators having the characteristics of data points 21 and 17 as shown by arrows 20 and 24, respectively. This is a significant advantage because the frequency-temperature characteristics can be adjusted by controlling Δf at the time the vibrators are massed produced. The same operations apply to electrode 56 for roughly adjusting $f_F$ and to electrode 58 for finally adjusting $f_F$.

Referring now to FIG. 18, a further embodiment of a mode coupled tuning fork type quartz crystal vibrator generally as 120 constructed and arranged in accordance with the invention is shown. An excitation electrode 125 extends across the base of vibrator 120 and along the principal surfaces of the tuning fork arms. An electrode 126 disposed at the top region of the tuning fork arms is for roughly adjusting $f_F$. An electrode 127 is for adjusting Δf and electrode 128 is for finely adjusting $f_F$. In this embodiment, electrode 126 for roughly adjusting $f_F$, electrode 127 for adjusting Δf and electrode 128 for finely adjusting $f_F$ are respectfully disposed at positions along the tuning fork arms in ranges 61, 60 and 59 of FIG. 12.

The shape of electrode 128 for finely adjusting $f_F$ in FIG. 18 are reversed in direction and position on the tuning fork arms compared to that of electrode 58 for finely adjusting $f_F$ in FIG. 11. Electrode 128 is disposed in a position farther away from the top of the arm that is electrode 127 for adjusting Δf. The reason this may be done is that displacement $U_x$ in the flexual mode is large in the top region of the tuning fork arm where electrode 58 is disposed for finely adjusting $f_F$ and displacement $U_x$ is also large in the base region of the tuning fork arm wherein electrode 128 is disposed for finally adjusting $f_F$ in vibrator 120 of FIG. 18.

Adjustments of Δf and $f_F$ for vibrator 120 are performed by the same method described in connection with FIG. 13. The respective positions of the electrodes on Y' axis along the length of tuning fork arm are as follows. Assuming the length of tuning fork arm to be 1.0 along axis Y', electrode 126 for roughly adjusting $f_F$ is disposed in the region about 0 to 0.2 from the top of the tuning fork arm. Electrode 127 for adjusting Δf is disposed in the region about 0.1 to 0.4 from the top of tuning fork arm. Finally, electrode 128 for finally adjusting $f_F$ is disposed in the region about 0.2 to 0.5 from the top of tuning fork arm.

Referring now to FIG. 19, a mode coupled tuning fork type quartz crystal vibrator known generally as 122 constructed and arranged in accordance with another embodiment of the invention is shown. An electrode 129 is the excitation electrode extending from the tuning fork base along a portion of each of the tuning fork arms. An electrode 130 is for adjusting Δf and an electrode 131 is for finely adjusting $f_F$ are provied in the vicinity of the top of the tuning fork arms. In accordance with this embodiment of the invention, only vibrators having deviations of frequencies within 100 ppm with respect to $f_{F0}$ may be adjusted because the embodiment does not contemplate disposing an electrode for roughly adjusting $f_F$ in the vibrator. This embodiment is significant because the dimensions can be controlled during mass production to maintain the mean value of the dispersion of $f_F$ to be $f_{F0}$.

The position of each electrode to be disposed in accordance with this embodiment of the invention is as follows. Assuming a tuning fork arm of 1.0 extending along Y' axis, electrode 131 for finally adjusting $f_F$ is disposed at a position in the region between about 0 to 0.2 from the top of the tuning fork arm and electrode 130 for adjusting Δf is disposed at a position in the region between about 0.1 to 0.5 from the top of the tuning fork arm.

Referring specifically to FIG. 20, yet another embodiment of a mode coupled tuning fork type quartz crystal vibrator shown generally as 123 constructed and arranged in accordance with the invention is shown. In this embodiment, vibrator 123 includes an excitation electrode 132 disposed along the base region of the tuning fork and extending along the tuning fork arms. Vibrator 23 included electrodes 133 for finely adjusting $f_F$ and electrodes 134 for adjusting Δf. An electrode for roughly adjusting $f_F$ is deleted from this embodiment as with respect to vibrator 122 of FIG. 19.

Assuming the length of the tuning fork arms to be 1.0 extending in the direction of the Y' axis, the position of each electrode disposed thereon is as follows. Electrodes 133 for finely adjusting $f_F$ are disposed at a position in region about 0.2 to 0.5 from the top of the vibrator arms. Electrodes 134 for adjusting Δf an disposed at positions in the region between about 0.1 to 0.4 from the top of the vibrator arms.

Figure 21:
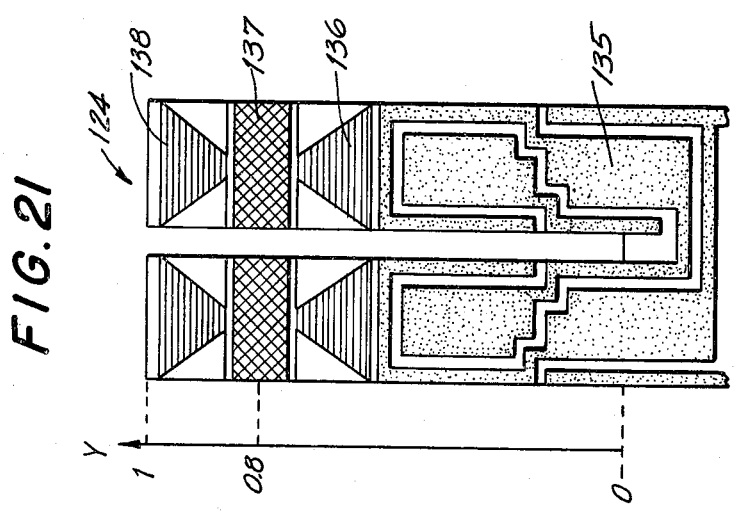
FIG. 21 is a plan view of a vibrator electrode pattern in accordance with yet a further embodiment of the invention.

Referring now to FIG. 21, yet another embodiment of a mode coupled tuning fork type quartz crystal vibrator shown generally as 124 constructed and arranged in accordance with the invention is shown. An excitation electrode 135 is disposed along the base portion of the tuning fork and extends along the tuning fork arm. Electrodes 138 in the form of inverted triangles and electrode 136 in the form of triangles for finely adjusting $f_F$ and electrodes 137 for adjusting Δf are disposed in the vicinity of the ends of the tuning fork arms. In this embodiment of the invention, two electrodes, 136 and 138 on each tuning fork arm are provided for finally adjusting $f_F$. The final adjustments of $f_F$ can be performed with great precision by removing portions of these two electrodes by use of a laser beam.

Assuming a tuning fork arm of length 1.0 extending along Y' axis, the position of each electrode in accordance with this embodiment of the invention is as follows. Electrodes 136 and 138 for finely adjusting $f_F$ are disposed at position in the region about 0.0 to 0.2 and in the region 0.2 to 0.5 from the top of the vibrator arm. Electrod 137 for adjusting Δf is disposed intermediate electrodes 136 and 138 at positions in the region between 0.1 and 0.4 from the top of the vibrator arms and extend across the full width of the tuning fork arms.

Figures 22A, 22B:
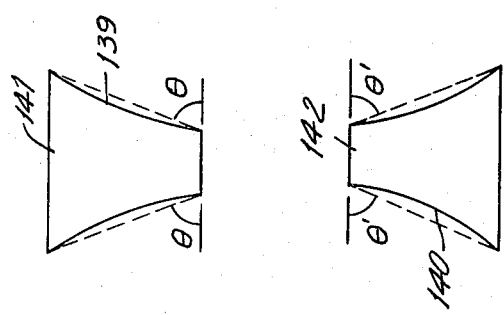
FIG. 22 is a plan view of an electrode pattern for finely adjusting $f_F$ in accordance with another embodiment of the invention.

Referring now to FIGS. 22a and 22b, the shape of electrodes 141 and 142 for finely adjusting $f_F$ in accordance with another embodiment of the invention is shown. Angles θ and θ' are in the range of between about 30° and 80°. Sides 139 and 140 are concave extending from one side of the electrode to the other side of the electrode along the length of the tuning fork arm. While this embodiment of the invention sides 130 and 140 are curved lines, they may be straight lines so as to present substantially triangular electrodes as shown in FIGS. 11, 14, 15 18, 19, 20 and 21. The shape of electrodes 141 and 142 in FIG. 22a and 22b are referred to as "a triangle" and θ and θ' are referred to as "the angles between the oblique lines and the width direction of the tuning fork arm", notwithstanding the slight curvature of sides 139 and 140.

In order to enable the above described method for adjusting the frequency operate more effectively, it is preferred that the metal film deposited as electrodes be thickly deposited. Preferred methods of depositing metal electrodes include spattering or plating on the electrodes. For example, in the embodiment illustrated in FIG. 11 this includes electrode 56 for roughly adjusting $f_F$, electrode 57 for adjusting $\Delta f$ and electrode 58 for finely adjusting $f_F$. In the above described explanation with respect to the adjusting method in accordance with the invention, the method has been described wherein the adjustments are performed by removal of electrode films by applying laser beam. It is to be understood that it is within the contemplation of the invention that adjustments can be made by deposition or by deposition together with removal of portions of the electrode films by applying a laser beam to the electrode.

In accordance with the invention, the frequency-temperature characteristics are controlled by the value of $\Delta f$. However, the frequency-temperature characteristics may also be controlled by R which equals the ratio: $R = f_T/f_F$, wherein $f_F$ and $f_T$ are the values of the resonant frequency of the first overtone of the flexural mode and the resonant frequency of the fundamental vibration of the torsional mode, respectively, at 20° C. Following these adjustments, $f_F = f_T$ because when $\Delta f < f_F$, the shape of the electrode for finally adjusting $f_F$ is about the same as the shape of the electrode for controlling the frequency-temperature characteristic by adjusting $\Delta f$. Specifically, by way of example when $\Delta f = 4$ KHz, $f_F = 200$ KHz.

As pointed out above, for a mode coupled tuning fork type quartz crystal vibrator utilizing coupling of the first overtone of the flexural mode and the fundamental vibration of the torsional mode, electrodes for roughly adjusting $f_F$ and electrodes for adjuting $\Delta f$ may be disposed in the vicinity of the top of the tuning fork arm. By this method, $f_F$ and $\Delta f$ are adjusted to predetermined values of $f_{F0}$ and $\Delta f_0$. In accordance with this embodiment of the invention, productivity of suitable mode coupled tuning fork type quartz crystal vibrators suitable for use as time standards in electronic timepieces can be increased. Additionally, an electronic wristwatch with the long useful life of high accuracy can been obtained by utilizing the mode coupled tuning fork type quartz crystal vibrator constructed and arranged in accordance with the invention as a time standard.

It is also understood that the concept of this invention can be adapted to mode coupled tuning fork type quartz crystal vibrators utilizing vibration in another mode. Specifically, the invention can be applied by disposing electrodes for adjusting the resonant frequency of the main vibration and an electrode for adjusting the frequency-temperature characteristic of the main vibration on the tuning fork arm. The main vibration may be any vibrational mode which oscillates for use in an oscillation circuit.

It will thus be seen that the objects set forth above, among those made apparent from the preceding description, are efficiently attained and, since certain changes may be made in carrying out the above method and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A mode coupled quartz crystal vibrator coupling two different modes of vibration, comprising:
a quartz crystal plate cut in the shape of a tuning fork having a base region, two coplanar tuning fork arms extending from the base for vibrating in a main vibrational mode and a different second vibrational mode and having excitation electrodes on the principal surfaces of said plate;
first adjust electrode means for adjusting the resonant frequency of the main vibration; and
second adjust electrode means for adjusting the difference ($\Delta f$) between the resonant frequency of the main vibration and the resonant frequency of the sub-vibration for adjusting the frequency-temperature characteristics of the vibrator,
said first adjust and second adjust electrode means formed on the surface of the arms in the region near the top of the arms.

2. The mode coupled vibrator of claim 1, wherein the main vibrational mode is the flexural mode with the resonant frequency of the first overtone of the flexural mode designated $f_F$, and the secondary vibrational mode is the torsional mode with the resonant frequency of the fundamental vibration of the torsional mode is designated $f_T$.

3. The mode coupled vibrator of claim 2, wherein the first adjust electrode means for adjusting the resonant frequency of the main vibration includes a first electrode film which does not extend across the full width of the tuning fork arms along the length of the vibrator and is disposed on both principal planar surfaces of each arm.

4. The mode coupled vibrator of claim 3, wherein the first adjust electrode film is an inverted substantially triangular electrode with the vertex of the triangle facing the vibrator base and is disposed at the top of each arm.

5. The mode coupled vibrator of claim 2, wherein second adjust electrode means for adjusting $\Delta f$ is substantially rectangular electrode and is disposed on both principal planar surfaces of each arm.

6. The mode coupled vibrator of claim 2, wherein the first adjust electrode means is an inverted substantially triangular electrode disposed at a position from 0 to 0.2 from the top of the tuning fork arms and the second adjust electrode means includes rectangular electrodes disposed at a position from 0.1 to 0.4 from the top of the tuning fork arms, said arms having a length of 1.0 and said electrodes disposed on both principal surfaces of each arm.

7. The mode coupled vibrator of claim 6, wherein a portion of each triangular electrode is removed for adjusting the frequency-temperature characteristics and the oscillation frequency of the vibrator.

8. The mode coupled vibrator of claim 7, wherein the electrode portions are removed by applying a laser beam to the electrode.

9. The mode coupled vibrator of claim 6, further including an additional strip of metal film deposited on each triangular electrode and each rectangular electrode for adjusting the frequency-temperature characteristics and the oscillation frequency of the vibrator.

10. The mode coupled vibrator of claim 6, wherein a portion of one of eah triangular electrode and each rectangular electrode have been removed by a applying a laser beam to the electrodes for adjusting the frequency-temperature characteristics and the oscillation frequency of the vibrator.

11. The mode coupled vibrator of claim 6, wherein one of each triangular electrode and each rectangular electrode are a thick deposit of metal film with a portion of said one of the electrodes having been removed by applying a laser beam thereto, and further including an additional strip of metal film deposited on the other electrodes for adjusting the frequency-temperature characteristics and the oscillation frequency of the vibrator.

12. The mode coupled vibrator of claim 6, wherein both the triangular electrodes and rectangular electrodes are thick deposits of metal film and a portion of each of the triangular electrodes and each of the rectangular electrodes have been removed by applying a laser beam thereto for adjusting the frequency-temperature characteristics and the oscillation frequency of a vibrator.

13. A mode coupled vibrator of claims 7, 9, 10, 11 or 12, wherein each of the electrode portions removed and the additional strips of metal film added to the adjust electrodes are traverse to the length of the tuning fork arm and extend across the width of the electrode.

14. The mode coupled vibrator of claim 3, wherein the first adjust electrode means is in the form of a circle formed in a position between 0.1 and 0.2 from the top of a tuning fork arm, said arm having a length of 1.0, said circle not extending across the full width of the tuning fork arms.

15. The mode coupled vibrator of claim 2, wherein the first adjust electrode means for adjusting $f_F$ includes electrodes for roughly adjusting $f_F$ disposed at a position from 0.3 to 0.5 from the top of the tuning fork arms and substantially triangular electrodes for finely adjusting $f_F$ disposed at a position from 0 to 0.2 from the top of the tuning fork arms, and the second adjust electrode means includes rectangular electrodes disposed at a position from 0.1 to 0.4 from the top of the tuning fork arms, said arms having a length of 1.0 and said electrodes disposition both principal surfaces of each arm.

16. The mode coupled vibrator of claim 15, wherein said rectangular electrodes for roughly adjusting $f_F$ extend across the full width of the tuning fork and the vertex of said triangular electrodes face the turning fork arms.

17. A mode coupled quartz crystal vibrator coupling two different modes of vibration, comprising:
a quartz crystal plate cut in the shape of a tuning fork having a base region and two coplanar tuning fork arms extending from the base for vibrating in a first flexural mode of vibration ($F_1$) and a secondary torsional mode of vibration ($T_0$), said vibrator utilizing the first overtone of the flexural mode and the fundamental vibration of the torsional mode and having excitation electrodes on both principal surfaces of said plate;
first adjust electrode means for adjusting $f_F$, the resonant frequency of the main vibration; and
one of second adjust electrode means for adjuting $\Delta f$, the difference between the resonant frequency of the main vibration $f_F$ and the resonant frequency of the secondary vibration $f_T$ designated $\Delta f = f_F - f_T$ and third adjust electrode means for adjusting $R = f_T/f_F$, wherein $f_F$ and $f_T$ are the resonant frequencies at 20° C., for adjusting the frequency-temperature characteristics of the vibrator,
said first electrode means and one of said second and third adjust electrode means are formed in the region near the top of the tuning fork arms.

18. The mode coupled vibrator of claim 17, wherein the first electrode means for adjusting $f_F$ includes substantially triangular electrodes for finely adjusting $f_F$ disposed in the region from 0 to 0.2 from the top of the tuning fork arm and electrodes for roughly adjusting $f_F$ in the region f 0.3 to 0.5 from the top of the tuning fork arm, the second adjust electrode means for adjusting $\Delta f$ and the third adjust electrode means for adjusting R include electrodes disposed in the region of from 0.1 to 0.4 from the top of the tuning fork arm, said arms having a length of 1.0 and said electrodes being disposed on both principal surfaces of each arm.

19. The mode coupled vibrator of claim 18, wherein each triangular electrode is formed with the vertex facing the vibrator base.

20. The mode coupled vibrator of claim 17, wherein the first adjust electrode means for adjusting $f_F$ includes electrodes for roughly adjusting $f_F$ disposed on the turning fork arm in the region from 0 to 0.2 from the top of the tuning fork arm and substantially triangular electrodes for finely adjusting $f_F$ in the region from 0.2 to 0.5 from the top of the tuning fork arm and the second adjust electrode means for adjusting $\Delta f$ and the third electrode means for adjusting R includes electrodes in the region of from 0.1 to 0.4 from the top of the tuning fork arms, said arm having a length of 1.0 and said electrodes disposed on both principal surfaces of each arm.

21. The mode coupled vibrator of claim 20, wherein each triangular electrode is formed with the vertex facing the top of the vibrator arms.

22. The mode coupled vibrator of claim 17, wherein the first adjust electrode means for adjusting $f_F$ includes substantially triangular electrodes for finely adjusting $f_F$ disposed in the region of from 0 to 0.2 from the top of the tuning fork arm, and the second adjust electrode means for adjusting $\Delta f$ and the third adjust electrode means for adjusting R include electrodes disposed in the region of 0.1 to 0.5 from the top of the tuning fork arm, said arms having a length of 1.0 and said electrodes being disposed on both principal surfaces of each arm.

23. The mode coupled vibrator of claim 21, wherein each triangular electrode is formed with the vertex facing the vibrator base.

24. The mode coupled vibrator of claim 17, wherein the first adjust electrode means for adjusting $f_F$ includes substantially triangular electrodes for finely adjusting $f_F$ disposed in the region of from 0.2 to 0.5 from the top of the tuning fork arms, and the second adjust electrode means for adjusting $\Delta f$ and the third adjust electrode means for adjusting R including electrodes disposed in the region of from 0.1 to 0.4 from the top of the tuning fork arms, said arms having a length of 1.0 and said electrodes being disposed on both principal surfaces of each arm.

25. The mode coupled vibrator of claim 23, wherein each triangular electrode is formed with the vertex facing the top of the vibrator arms.

26. The mode coupled vibrator of claim 17, wherein the first adjust electrode means for adjusting $f_F$ includes substantially triangular electrodes for finely adjusting $f_F$ disposed in the region of from 0 to 0.2 and in the region from 0.2 to 0.5 from the top of the tuning fork arms, and the second adjust electrode means for adjusting $\Delta f$ and the third adjust electrode means for adjusting R are disposed in the range of from 0.1 to 0.4 from the top of the tuning fork arm, said arms having the length of 1.0 and said electrodes being disposed on both principal surfaces of each said arm.

27. The mode coupled vibrator of claim 26, wherein each triangular electrode disposed in the region from 0 to 0.2 is formed with the vertex facing the vibrator base and each triangular electrode disposed in the region from 0.2 to 0.5 is formed with the vertex facing the top of the vibrator arms.

28. The mode coupled vibrators of claims 17, 18, 22 and 26 wherein the triangular electrode for finely adjusting $f_F$ disposed in the range of from 0 to 0.2 from the top of the tuning fork arm include oblique lines intersecting a line across the width direction of the tuning fork arm between about 30° and 80°.

29. The mode coupled vibrator of claims 17, 20, 24 or 26, wherein the triangular electrodes for finely adjusting $f_F$ disposed in the range of from 0.2 to 0.5 from the top of the tuning fork arm include oblique lines which intersect a line drawn across the width direction of the tuning fork arm at an angle between about 30° and 80°.

30. A method for forming a mode coupled tuning fork type quartz crystal vibration having two opposed principal planar surfaces, said vibrator coupling two different modes of vibration, the main vibration mode being the flexural mode ($f_1$) with the resonant frequency of the first overtone of the flexural mode being designated $f_F$, and the sub-vibrational mode being the torsional mode ($T_0$), the resonant frequency of the fundamental vibration of the torsional mode being designated $f_T$, comprising:
forming first adjust electrode means for adjusting $f_F$, by disposing first adjust electrodes at the region at the top of the tuning form arms and on both principal surfaces of the vibrator, said electrodes formed so as not to extend across the full width of the arms along the length of the electrode; and
forming second adjust electrode means for adjusting $\Delta f = f_F - f_T$ for adjusting the frequency-temperature characteristics of the vibrator, by disposing second adjust electrodes at the region of the top of the tuning fork arms, and electrodes formed on both principal surfaces of the vibrator.

31. The method of claim 30, including the step of forming the first adjust electrode in the shape of an substantially triangular electrode with the vertex of the triangle facing the vibrator base and disposing the triangular electrode at the top of the tuning fork arms.

32. The method of claim 31, including the steps of:
adjusting the frequency-temperature characteristics and the oscillation frequency of the vibrator by one of the steps of removing a strip of electrode material and depositing a strip of metal from each second adjust electrode so that $\Delta f$ is adjusted to a preselected value $\Delta f_0$; and
adjusting $f_F$ to a preselected value $f_{F0}$ at the same time maintaining $\Delta f$ at the preselected value $\Delta f_0$ by one of the steps of removing a strip of electrode material from and depositing a metal strip on the first adjust electrodes for adjusting $f_F$.

33. A method for forming a mode coupled tuning fork type quartz crystal vibrator having two opposed principal planar surfaces, said vibrator coupling two different modes of vibration, the main vibration being the flexural mode ($F_1$) with the resonant frequency of the first overtone of the flexural mode being designated $f_F$, and the sub-vibrational mode being the torsional mode ($T_0$), the resonant frequency of the fundamental vibration of the torsional mode being designated $f_T$, comprising:
forming first adjust electrode means for adjusting $f_F$ by disposing electrodes having a substantially triangular shape for finely adjusting $f_F$ and substantially rectangular electrodes roughly adjusting $f_F$ at the region of the top of the tuning fork arms on both principal surfaces of each arm;
forming second adjust electrode means for adjusting one of $\Delta f = f_F - f_T$ and $R = f_F / f_T$, ($f_F$ and $f_T$ being the resonant frequencies at 20° C.), by disposing substantially rectangular electrodes at the region of the top of the tuning fork arms on both principal surfaces of each arm,
roughly adjusting $f_F$ by one of the steps of removing a strip of electrode material from and adding a strip of metal to each rectangular electrode for roughly adjusting $f_F$ to a value of about 100 ppm lower than a preselected frequency $f_{F0}$;
adjusting one of $\Delta f$ and $R$ by one of the steps of removing a strip of electrode material from and adding a strip of metal to each rectangular electrode for adjusting $\Delta f$ so that $\Delta f$ is adjusted to a preselected value $\Delta f_0$; and
finely adjusting $f_F$ to the preselected value $f_{F0}$ and at the same time maintaining $\Delta f$ at the preselected value $\Delta f_0$ by one of the steps of removing a strip of electrode material from and adding a strip of electrode material to each triangular electrode for finely adjusting $f_F$.

* * * * *